US006495945B2

(12) United States Patent
Yamaguchi et al.

(10) Patent No.: US 6,495,945 B2
(45) Date of Patent: Dec. 17, 2002

(54) PIEZOELECTRIC/ELECTROSTRICTIVE ELEMENT

(75) Inventors: Hirofumi Yamaguchi, Komaki; Nobuo Takahashi, Owariasahi, both of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/948,077

(22) Filed: Sep. 6, 2001

(65) Prior Publication Data
US 2002/0070639 A1 Jun. 13, 2002

(30) Foreign Application Priority Data
Sep. 11, 2000 (JP) ......................... 2000-275137

(51) Int. Cl.[7] .............................................. H01L 41/08
(52) U.S. Cl. ..................... 310/324; 310/366; 310/358
(58) Field of Search ................................ 310/324, 366, 310/358

(56) References Cited

U.S. PATENT DOCUMENTS 5,376,857 A * 12/1994 Takeuchi et al. ............ 310/328
5,430,344 A    7/1995 Takeuchi et al. ............ 310/330
5,692,279 A * 12/1997 Mang et al. ................. 29/25.35
5,814,920 A * 9/1998 Takeuchi et al. ............ 310/324

FOREIGN PATENT DOCUMENTS

EP         0629007 A1 * 12/1994 ............ H01I/41/09

OTHER PUBLICATIONS

Takenaka, Tadashi, et al., *Mechanical properties of $(Bi_{1/2} Na_{1/2}) TiO_3$ —based Piezoelectric Ceramics*, Silicates Industriels, Aug. 7, 1993, pp. 136–142.

* cited by examiner

Primary Examiner—Thomas M. Dougherty
(74) Attorney, Agent, or Firm—Burr & Brown

(57) ABSTRACT

A ceramic substrate 1 comprises a thin diaphragm portion 3 and a thick portion 2. A lower electrode 4 is formed on the ceramic substrate and is spaced apart from an auxiliary electrode 8, also formed on the ceramic substrate. A bonding layer 7C comprises an insulator and is formed on the ceramic substrate between the lower and auxiliary electrodes. A piezoelectric/electrostrictive layer 5 is formed on at least a portion of each of the lower electrode, the auxiliary electrode and the bonding layer. An upper electrode 6 extends over the piezoelectric/electrostrictive layer and contacts the auxiliary electrode. A bonded portion exists wherein the bonding layer serves to completely bond together the substrate and the piezoelectric/electrostrictive film layer.

6 Claims, 2 Drawing Sheets

PIEZOELECTRIC/ELECTROSTRICTIVE ELEMENT

FIELD OF THE INVENTION

The present invention relates to piezoelectric/electrostrictive elements, and in particular to piezoelectric/electrostrictive elements employed as actuators utilizing flexural displacement and sensors for detecting fluid properties, sound pressure, minute weights and accelerations, etc., as for example, in microphones or viscosity sensors.

BACKGROUND OF THE INVENTION

Piezoelectric/electrostrictive film elements are utilized in various types of actuators and sensor devices. The various applications of piezoelectric/electrostrictive film elements include the measuring of various properties of fluids, such as the measuring of the properties of density, concentration and viscosity, etc., as disclosed, for example, in Japanese Patent publication No. 8-201265A. Such elements are conveniently employed as sensors because there is a correlation between the amplification of a piezoelectric/electrostrictive oscillator and the viscosity resistance of a fluid in contact with the oscillator. To quantify this correlation, piezoelectric/electrostrictive elements exploit the principal that the form of oscillation in a mechanical system like the oscillation of an oscillator can be converted to an equivalent circuit in an electrical system. For example, a piezoelectric/electrostrictive film oscillates in a fluid and receives a mechanical resistance based on the viscosity resistance of the fluid. Based on the above-mentioned principle, the oscillator thereby senses the variation of an electrical constant of an equivalent electrical circuit of the piezoelectric/electrostrictive element configuring the oscillator. As a result, it becomes possible to measure various parameters, which include the viscosity, density and concentration of the fluid.

A piezoelectric/electrostrictive film oscillator has the capability to measure fluids in both the liquid and gas phases. Moreover, the above oscillator is capable of not only measuring liquids consisting of a single constituent element (i.e., water, alcohol, or oils, etc.) but may also measure fluids composed of slurries and pastes into which a soluble or insoluble medium is dissolved, mixed or suspended.

Examples of the electrical constants that a piezoelectric/electrostrictive oscillator is capable of detecting include loss factor, phase, resistance, reactance, conductance, susceptance, inductance and capacitance. Particularly preferred electrical constants are phase and loss factors because they have a single maximum or minimum point of variation near the resonance frequency of an equivalent circuit. Consequently, not only can the viscosity of a fluid be measured, but its density and concentration are capable of being quantified as well. For example, the concentration of sulfuric acid in an aqueous solution of sulfuric acid can be measured through the use of the above electrical constants. Furthermore, in addition to the use of electrical constants, the variation in resonance frequency may also be utilized as an index for sensing variations in the form of oscillation insofar as there are no specific problems from the standpoint of precision of measurement and durability.

FIG. 2 illustrates a conventional piezoelectric/electrostrictive film element as disclosed in Japanese Patent publication No. 5-267742A. An auxiliary electrode 8 is formed at a position independent of a lower electrode 4, which is laminated on a ceramic substrate 1 having a thin diaphragm 3 and a thicker portion 2. The fluid to be analyzed is introduced into a hollow portion 10 via through-hole 9. A portion of the auxiliary electrode is positioned beneath a piezoelectric/electrostrictive film 5. As a result of this configuration, it is possible to improve the reliability of the connection of an upper electrode 6 through the continuous formation (i.e., without a break in the connection) of the upper electrode on the face of the auxiliary electrode 8 and the piezoelectric/electrostrictive film 5.

A piezoelectric/electrostrictive film element is also disclosed in Japanese Patent publication No. 6-260694A. As shown in FIG. 2, a piezoelectric/electrostrictive film 5 is positioned on a lower electrode 4 and is of a size that the surrounding portion of the piezoelectric/electrostrictive film 5 extends beyond the electrode 4. As a consequence, it is not necessary to precisely position the lower electrode 4 and the piezoelectric/electrostrictive film 5, and thus short circuits between the upper and the lower electrodes are easily prevented. Additionally, an extending portion 11 of the piezoelectric/electrostrictive film can manifest more than sufficient flexural displacement, generation and oscillation because it is in an incompletely bonded state with the substrate 1 (i.e., the extended portion 11 is not bonded with the substrate due to the purpose of incompletely bonded portions 7A). An "incompletely bonded state" means that a portion of the extending portion 11 is either partially bonded to the ceramic substrate or that an unbonded region without any bonded portion is in existance. More specifically, "incompletely bonded state" is defined to mean that the peeling (tear-off) strength of the film 5 to the substrate 1 is 0.5 kg/mm² or less.

With respective to the formation of an unbonded state as described above, there are instances when it is necessary to have a low reactivity between the materials selected for the substrate and the piezoelectric/electrostrictive film. In this regard, it is also possible to form a dummy layer between the piezoelectric/electrostrictive film and the substrate so as to prevent their direct contact. Ideally, the dummy layer is formed by a stamping method, a screen printing method or an ink jet method. The incompletely bonded portion 7A is formed when the dummy layer is subsequently dissolved. For example, the dummy layer is fabricated with combustible/removable materials (i.e., resin materials, etc.,) that are dissolved away to form the incompletely bonded portions 7A when the piezoelectric/electrostrictive film 5 is heat treated. Alternatively, in the case where the piezoelectric/electrostrictive film and the upper electrode are not heat treated, the dummy layer is formed with a resin material to be dissolved in a composition such as water or organic solvents, etc. Accordingly, after the formation of either the piezoelectric/electrostrictive film 5 alone or in conjunction with the upper electrode 6, the incompletely bonded portion 7A is formed by dissolving or removing the dummy layer (i.e., water or organic solvents, etc.).

In the above-described prior art piezoelectric/electrostrictive oscillators, the electrical constants between the individual sensor elements tend to vary in both the initial phase with the subsequent passage of time. In such cases, a bothersome fine-tuning process is required to insure the proper performance of the oscillator. In such prior art piezoelectric/electrostrictive oscillators employed as sensor elements utilizing electrical constants, an incompletely bonded portion 7B, which is in the same incompletely bonded state as the incompletely bonded state 7A of the extending portion 11, is formed between the lower electrode 4 and auxiliary electrode 8. Variations and alterations in the incompletely bonded state of this incompletely bonded portion 7B are the principal cause of changes in the oscillation of the sensor elements, which, in turn, yields alterations in the electrical constants of prior art piezoelectric/electrostrictive oscillators. That is to say that the incompletely bonded state of prior art devices is a drawback because the incompletely bonded state 7B is not reliably replicated. For example, since the thin diaphragm oscillates or is displaced, partial destruction of the bond or microscopic cracking at the portion of 7B is likely to occur when the oscillator is in operation.

SUMMARY OF THE INVENTION

The present invention relates a piezoelectric/electrostrictive element comprising successively laminated layers. A lower electrode and an auxiliary electrode having a space formed therebetween are laminated on a ceramic substrate. A bonding layer comprising an insulator is formed on the ceramic substrate between the lower and auxiliary electrodes. A piezoelectric/electrostrictive layer is formed on at least a portion of each of the lower electrode, the bonding layer and the auxiliary electrode. An upper electrode extends over the piezoelectric/electrostrictive layer and contacts the auxiliary electrode. The bonding layer forms a completely bonded portion that comprises portions of the ceramic substrate, the lower electrode, the auxiliary electrode and the piezoelectric/electrostrictive layer.

"Completely bonded" refers to the peeling (tear-off) strength of the piezoelectric/electrostrictive film after the substrate, bonding layer and piezoelectric/electrostrictive film have been integrated into a unit. The peeling (tear-off) strength is 2 kg/mm$^2$ or greater.

The piezoelectric/electrostrictive layer preferably comprises at least one material selected from the group consisting of lead titanate, lead zirconate, lead-magnesium niobate and lead-nickel niobate. The piezoelectric/electrostrictive layer may also be preferably formed from $(Bi_{0.5}Na_{0.5})TiO_3$ or a material having $(Bi_{0.5}Na_{0.5})TiO_3$ as its principal constituent. Furthermore, the piezoelectric/electrostrictive layer more preferably comprises $(1-x)$ $(Bi_{0.5}Na_{0.5})_3$—$xKNbO_3$ ($0 \leq x \leq 0.06$ in mole proportions) or a material having $(1-x)(Bi_{0.5}Na_{0.5})TiO_3$—$xKNbO_3$ ($0 \leq x \leq 0.06$ in mole proportions) as its principal constituent.

It is preferable that the bonding layer of the piezoelectric/electrostrictive film element be selected from an insulator material having a softening point at or above the heat treating temperature of the piezoelectric/electrostrictive layer.

The piezoelectric/electrostrictive layer can be completely bonded to the ceramic substrate most effectively when it is formed from either $(Bi_{0.5}Na_{0.5})TiO_3$ or $(1-x)(Bi_{0.5}Na_{0.5})TiO_3$—$xKNbO_3$ ($0 \leq x \leq 0.06$ in mole proportions) or a material having either one of the above as its principal constituent. In both of the above configurations, the completely bonded state is brought about by providing a bonding layer formed on the ceramic substrate between the lower electrode and the auxiliary electrode, both of which are also laminated on the ceramic substrate. The insulator material of the bonding layer is formed of $(1-x)(Bi_{0.5}Na_{0.5})TiO_3$—$x$ $KNbO_3$ ($0.08<x<0.5$ in mole proportions) or a material having $(1 \times x)$ $(Bi_{0.5}Na_{0.5})TiO_3$—$xKNbO_3$ ($0.08<x<0.5$ in mole proportions) as its principal constituent. Employing the above bonding layer results in a completely bonded state between portions of the ceramic substrate, the lower electrode, the auxiliary electrode and the piezoelectric/electrostrictive layer.

DETAILED DESCRIPTION OF THE INVENTION

Figure 1A:
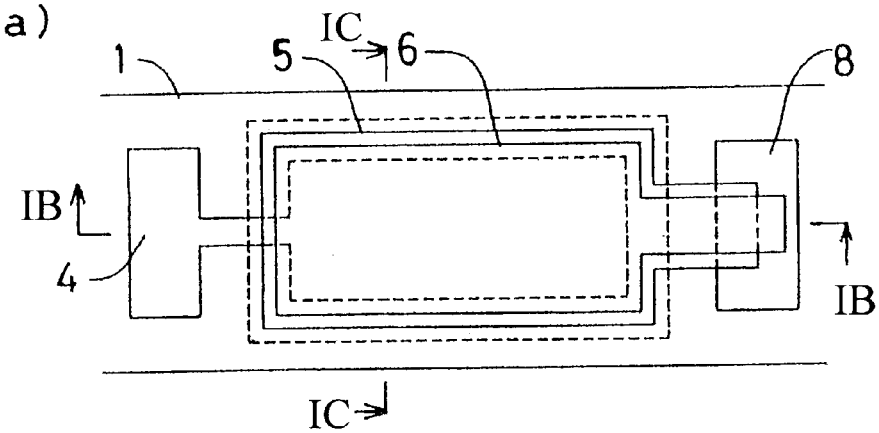
FIG. 1(a) is a top view showing an embodiment of the piezoelectric/electrostrictive film element of the present invention.
Figure 1B:
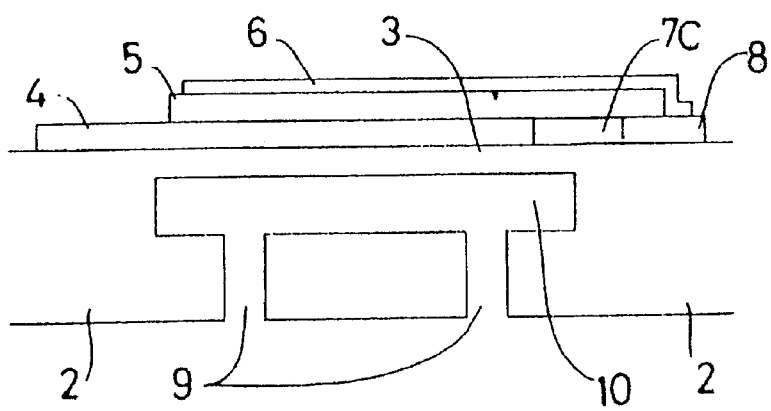
FIG. 1(b) is a cross-sectional view of an embodiment of the piezoelectric/electrostrictive film element taken through the IB—IB of FIG. 1(a)
Figure 1C:
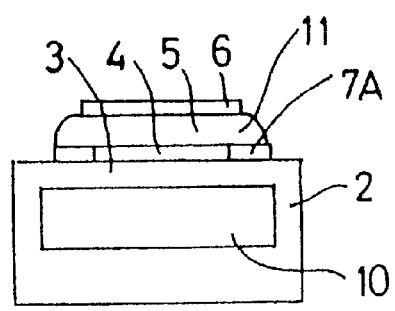
FIG. 1(c) is another cross-sectional view taken through line IC—IC of FIG. 1(a)
Figure 2A:
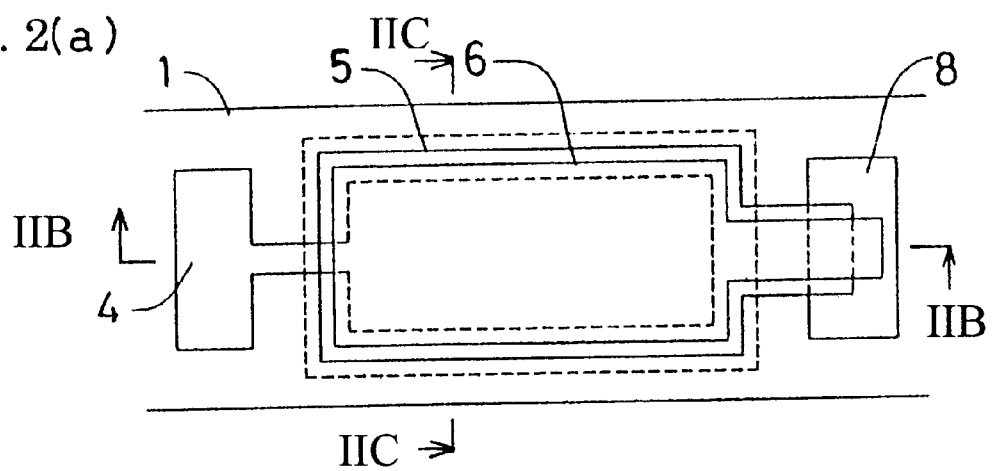
FIG. 2(a) is a top view showing an embodiment of a prior art piezoelectric/electrostrictive film element.
Figure 2B:
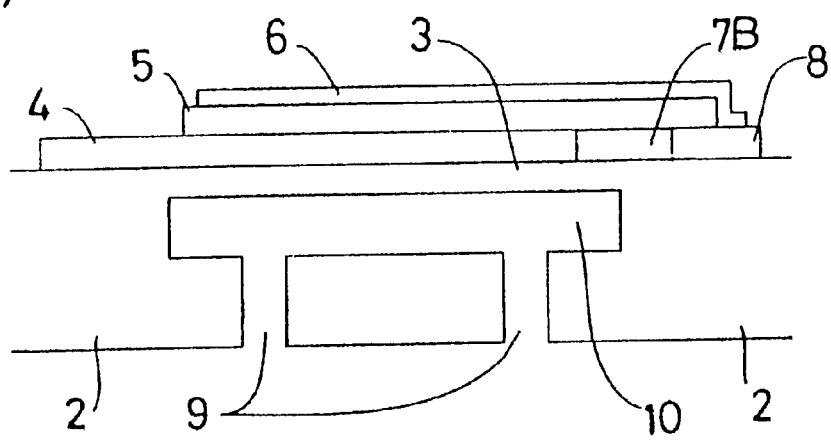
FIG. 2(b) is a cross-sectional view taken through line IIB—IIB of FIG. 2(a)
Figure 2C:
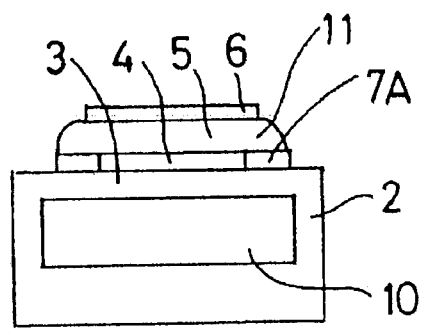
FIG. 2(c) is another cross-section view taken through the IIC—IIC of FIG. 2(a).

FIG. 1(a) is a plan view and FIG. 1(b) is a cross-sectional view of a piezoelectric/electrostrictive element in accordance with one embodiment of the present invention. The piezoelectric/electrostrictive film element is an integrated structure formed by successively laminating several layers through known film forming methods. The piezoelectric/electrostrictive film element is formed on a ceramic substrate 1 comprising a thin diaphragm portion 3 and a thick portion 2. The piezoelectric/electrostrictive film 5 is sandwiched between a lower electrode 4 and an upper electrode 6 on the ceramic substrate 1. The lower electrode 4 and the auxiliary electrode 8 are formed on the substrate to have a space therebetween. A bonding layer 7C consists of an insulator and is formed on the ceramic substrate 1 and is positioned between the lower electrode 4 and the auxiliary electrode 8. The bonding layer 7C serves to form a completely bonded portion between portions of the substrate 1, the lower electrode 4, the auxiliary electrode 8 and the piezoelectric/electrostrictive film layer 5.

A through hole 9 is formed in the bottom of substrate 1 in communication with a hollow portion 10. The structure below the hollow portion where the element contacts a fluid is not restricted and may be any type of structure such as a simple cavity structure without a cover and the like.

In the present invention an extend portion 11 is not always present. Also, when seeking to reduce the variations in the electrical constants and the variations of the element properties over time, the lower electrode 4 and the piezoelectric/electrostrictive film 5 may, on some occasions, be substantially the same size.

A material having heat resistance, chemical stability and insulating properties is desirable for the material of the ceramic substrate 1. Heat resistance characteristics may be required because a heating process may be employed when fabricating the lower electrode 4, the piezoelectric/electrostrictive film 5 and the upper electrode 6 into an integrated unit (explained below). Chemical stability an insulating properties may be required when the piezoelectric/electrostrictive film element is utilized as a sensing element to detect and quantify the properties of a liquid having conductive and corroding properties.

Taking into account the above-described characteristics of heat resistance, chemical stability and insulating properties, the ceramic substrate 1 may be formed from a variety of materials which include zirconium oxide, aluminum oxide, magnesium oxide, mullite, aluminum nitrid, silicon nitride and glass. Amount these, stabilized zirconium oxide is preferable because it maintains mechanical strength and has superior tenacity, which is advantageous for the formation of the thin diaphragm portion.

The thickness of the thin-walled diaphragm portion 3 of the ceramic substrate 1 should be generally 50 $\mu$m or less, preferably 30 $\mu$m or less and more preferably 15 $\mu$m or less so as not to obstruct the vibration of the piezoelectric/electrostrictive film layer 5. The configuration of the surface of the thin-walled diaphragm portion may be rectangular, square, triangular, elliptical, circular or the like. However, in sensor element applications requiring simplified resonance modes which are excited, rectangular and circular shapes are more appropriately selected.

The lower electrode 4 and the auxiliary electrode 8 are formed on the surface of the ceramic substrate 1 in the following manner. The lower electrode 4 is formed on one end of the ceramic substrate and is either equal in size in relation to the piezoelectric/electrostrictive film 5 formed on thin-walled diaphragm portion 3 or a specified predetermined, smaller size. One end of the lower electrode 4 is used as a lead terminal. On the other hand, the auxiliary electrode 8 is formed on the opposite end of the ceramic substrate 1 (i.e., opposite end from lower electrode 4) and is formed up to a specified position facing thin-walled diaphragm 3. One end of the auxiliary electrode 8 is also used for a lead terminal.

The lower electrode 4 and the auxiliary electrode 8 may be fabricated from the same or different electrically conductive materials that bond well with both the ceramic substrate 1 and the piezoelectric/electrostrictive film 5. More specifically, it is preferable to use an electrode material having platinum, palladium, rhodium, silver or alloys having these metals as its main constituent. In particular, if a heat treatment process is performed when forming the piezoelectric/electrostrictive film 5, platinum and alloys having platinum as its main constituent are optimally used.

Various types of known thin or thick film forming methods may be employed in the formation of the lower electrode 4 and the auxiliary electrode 8. More specifically, the thin film forming techniques which may be suitably selected include ion beam processing, sputtering, vacuum deposition, CVD, ion plating and plating, etc. The thick film forming methods which may be suitably selected include screen printing, spraying and dipping etc. In particular, of the above-mentioned film forming methods, sputtering and screen printing methods are more preferably used.

Prior to forming the piezoelectric/electrostrictive film 5, the bonding layer 7C is formed on the ceramic substrate 1 and is positioned between the lower electrode 4 and the auxiliary electrode 8. The bonding layer 7C consists of an insulator and acts to completely bond portions if the ceramic substrate 1 and the piezoelectric/electrostrictive film 5 to each other.

The bonding layer 7C may be formed from either organic or inorganic materials so long as the tightness and bonding properties are compatible for bonding both the piezoelectric/electrostrictive film 5 and ceramic substrate 1. Ideally, to ensure bonding with a greater reliability, the coefficient of thermal expansion of the material selected for use as the bonding layer 7C should have a value which falls between that of the coefficient of thermal expansion of the materials selected for use as the ceramic substrate 1 and the piezoelectric/electrostrictive film 5.

If a heat treatment process (i.e., sintering) is carried out during the formation of the piezoelectric/electrostrictive film 5, glass materials are ideally selected for the materials constituting the bonding layer 7C because of compatible adhesive and bonding properties with respect to both piezoelectric/electrostrictive film 5 and ceramic substrate 1. When selecting a glass material, it is desirable to select a material having a softening point equal to or greater than the heat treatment temperature of the piezoelectric/electrostrictive 5 because such materials strengthen the bond between piezoelectric/electrostrictive film 5 and the ceramic substrate 1 and can minimize distortion due to heat treatment since the softening point is high.

In addition, if the material selected for use as the piezoelectric/electrostrictive film 5 is $(Bi_{0.5}Na_{0.5})TiO_3$ or a material having $(Bi_{0.5}Na_{0.5})TiO_3$ as its principal component or if the material selected for use as the piezoelectric/electrostrictive film 5 is $(1-x)(Bi_{0.5}Na_{0.5})TiO_3$—$xKNbO_3$ ($0 \leq x \leq 0.06$ in mole proportions) or a material having $(1-x)(Bi_{0.5}Na_{0.5})TiO_3$—$xKNbO_3$ ($0 \leq x \leq 0.06$ in mole proportions) as its principal component, then the material selected for use as the bonding layer 7C should be made up of $(1-x)(Bi_{0.5}Na_{0.5})TiO_3$—$xKNbO_3$ ($0.08 \leq x \leq 0.5$ in mole proportions) or materials having $(1 \times x)(Bi_{0.5}Na_{0.5})TiO_3$—$xKNbO_3$ ($0.08 \leq x \leq 0.5$ in mole proportions) as its main constituent. In this instance, the reason that the above material is selected for use as the bonding layer 7C is because its adhesion properties are compatible with respect to both the piezoelectric/electrostrictive film 5 and the ceramic substrate 1. Also, a bonding layer formed from the above material acts to minimize adverse effects on both the piezoelectric/electrostrictive film 5 and the ceramic substrate 1 during the heating process.

That is to say, several benefits are obtained from selecting the material used for the bonding layer 7C $((1-x) Bi_{0.5}Na_{0.5})TiO_3$—$xKNbO_3$ ($0.08 \leq x \leq 0.5$ in mole proportions)) to include the same constituents as the material selected for the piezoelectric/electrostrictive film 5. For example, the adhesion of the bonding layer 7C to the piezoelectric/electrostrictive film 5 is compatible, there are few problems due to the diffusion of different types of elements, which occur readily when glass is used, and it is possible to have a good reactivity to the ceramic substrate 1 and a strong bond because the bonding layer 7C contains a large amount of $KNbO_3$. Moreover, since the material selected for use as the bonding layer 7C $((1-x)(Bi_{0.5}Na_{0.5})TiO_3$—$xKNbO_3$ ($0.08 \leq x \leq 0.5$ in mole proportions)) shows almost no piezoelectric properties, stable element properties can be obtained because oscillation, displacement and stress are not created by the electric field generated by the electrode 4 and the auxiliary electrode 8.

Known thick film forming techniques are employed to form the bonding layer 7C. In particular, stamping and screen printing are preferably used. Also, if the size of the portion to be formed is from several dozen to several hundred $\mu$m, ink-jet techniques are ideally used. In addition, if a heat treatment of the bonding layer 7C is required, it may be performed prior to, concurrently or after the formation of the piezoelectric/electrostrictive film 5.

The piezoelectric/electrostrictive film 5 is formed so that it extends over at least a portion of the lower electrode 4, the auxiliary electrode 8 and the bonding layer 7C. At a minimum, the piezoelectric/electrostrictive film 5 is of a size that covers at least a portion of the lower electrode 4. The material selected for use as the piezoelectric/electrostrictive film 5 may be any material which demonstrates a piezoelectric/electrostrictive effect. Examples of the material suitable for use as the piezoelectric/electrostrictive film 5 include lead-based ceramic piezoelectric/electrostrictive materials such as lead zirconate, lead titanic, lead titanate zirconate (PZT) and barium titanate, as well as other titanium-barium based ceramic ferroelectric materials having barium titanate as a principal constituent. Also suitable for use are polymer piezoelectric materials such as polyvinylidene fluoride (PVDF) or Bi-based ceramic materials such as $(Bi_{0.5}Na_{0.5})TiO_3$ and Bi layered ceramics. Of course, piezoelectric/electrostrictive film 5 may be composed of compounds and solid solutions of the above material, as well as those with additives added which have improved piezoelectric/electrostrictive properties.

PZT based piezoelectrics are ideally selected for use as the materials for very sensitive sensors because they have good piezoelectric properties. In the present invention, it is preferable to select a material for use as the piezoelectric/electrostrictive film 5 having at least one or more of lend titanate, lead zirconate, lead magnesium niobate and lead nickel niobate as its main constituent. In particular, the above materials are ideal in that the reactivity with the material constituting the substrate is low, the segregation of constituents during heat treatment is not likely to occur, process for maintaining the composition can be easily conducted and the desired composition and crystal structure can be obtained with ease.

If platinum or an alloy having platinum as its primary constituent is employed for use in the lower electrode 4 and the auxiliary electrode 8, it is preferable to select $(Bi_{0.5}Na_{0.5})TiO_3$ or materials having $(Bi_{0.5}Na_{0.5})TiO_3$ as its primary constituent for use in the piezoelectric/electrostrictive film 5 because the bondability is higher, variations in the properties among elements is decreased and a higher reliability can be attained. Among these, $(1-x)$ $(Bi_{0.5}Na_{0.5})TiO_3$—$xKNbO_3$ ($0 \leq x \leq 0.06$ in mole proportions) or materials having $(1-x)$ $(Bi_{0.05}Na_{0.5})TiO_3$—$xKNbO_3$ ($0 \leq x \leq 0.06$ in mole proportions) as its main constituent are even more preferable since they have comparatively good piezoelectric properties.

The above piezoelectric/electrostrictive materials can be employed to form the piezoelectric/electrostrictive film 5 by various known film forming methods such as those previously described with respect to the formation of the lower electrode 4 and the auxiliary electrode 8. From the standpoint of cost effectiveness, screen printing is best used.

The piezoelectric/electrostrictive film 5 formed with the above described materials is heated treated when necessary and combined into an integral unit with the lower electrode 4, the auxiliary electrode 8 and the bonding layer 7C. With the present invention, it is preferable to select $(Bi_{0.5}Na_{0.5})TiO_3$ or material having $(Bi_{0.5}Na_{0.5})TiO_3$ as its principal constituent, particularly $(1-x)$ $(Bi_{0.5}Na_{0.5})TiO_3$—$xKNbO_3$ ($0 \leq x \leq 0.06$ in mole proportions) or material having $(1-x)$ $(Bi_{0.5}Na_{0.5})TiO_3$—$xKNbO_3$ ($0 \leq x \leq 0.06$ in mole proportions) as its principal constituent. The selected material is then heated treated at a temperature of 900° C. to 1400° C., preferably from 1000° C. to 1300° C. to strengthen the bonding properties of the piezoelectric/electrostrictive film 5, the lower electrode 4, the auxiliary electrode 8 and the bonding layer 7C in order to minimize variations in element properties and increase reliability. The same is true when using PZT-based materials. During the heat treatment process, it is desirable to conduct the heat treatment while controlling the atmosphere with a vapor source for the piezoelectric/electrostrictive film 5 so that the piezoelectric/electrostrictive film 5 does not become unstable at high temperatures.

The upper electrode 6 is formed continuously on the piezoelectric/electrostrictive film 5 and extends over piezoelectric/electrostrictive film 5 and the auxiliary electrode 8.

The material selected for use in the upper electrode 6 is a highly conductive material with good bonding properties to the piezoelectric/electrostrictive film 5. The upper electrode 6 is also formed with the same known film forming techniques as that for the lower electrode 4 and the auxiliary electrode 8.

After film formation, the upper electrode 6 is heat treated as necessary and bonded to the piezoelectric/electrostrictive film 5 and the auxiliary electrode 8 to form an integral unit. Similar to the lower electrode 4, heat treatment of this sort is not always necessary.

If heat treatment is required for the bonding of the lower electrode 4, the bonding layer 7C, the piezoelectric/electrostrictive film 5 and the upper electrode 6, the heat treatment may be performed at the time each layer is respectively formed or all of the layers may be heat treated concurrently after the forming of each successive film. Needless to say, suitable heat treatment temperatures should be selected to ensure good bonding and to minimize the alteration in quality due to the diffusion of constituent elements during heat treatment.

In the piezoelectric/electrostrictive film element in accordance with the present invention, there is no variation in oscillation or alteration over time. The piezoelectric/electrostrictive film and a substrate are in a completely bonded state between a lower electrode and an auxiliary electrode and work to sense electrical constants in oscillation, thereby providing an ideal element for distinguishing fluid properties, distinguishing between liquids and gases, as well as an element that measures acoustic pressure and microscopic weights, acceleration or functions as an actuator element.

While the present invention has been described with reference to a particular preferred embodiment, it will be understood by those skilled in the art that various modifications and the like could be made thereto without departing from the spirit and scope of the invention as defined in the following claims.

What is claimed is:

1. A piezoelectric/electrostrictive element comprising:

a ceramic substrate having a thin diaphragm portion and a thick portion;

a lower electrode formed on a surface of the ceramic substrate;

an auxiliary electrode formed on the surface of the ceramic substrate at a location spaced apart from said lower electrode;

an insulating bonding layer formed on the surface of the ceramic substrate between the lower electrode and the auxiliary electrode;

a piezoelectric/electrostrictive layer formed on at least a portion of the lower electrode, at least a portion of the bonding layer and at least a portion of the auxiliary electrode; and an upper electrode formed on the piezoelectric/electrostrictive layer;

wherein the bonding layer forms a completely bonded part comprising portions of the ceramic substrate, the lower electrode, the auxiliary electrode and the piezoelectric/electrostrictive layer.

2. The piezoelectric/electrostrictive element of claim 1, wherein said piezoelectric/electrostrictive layer comprises at least one material selected from the group consisting of lead titanate, lead zirconate, lead-magnesium niobate and lead-nickel niobate.

3. The piezoelectric/electrostrictive element of claim 1, wherein said piezoelectric/electrostrictive layer comprises $(Bi_{0.5}Na_{0.5})TiO_3$.

4. The piezoelectric/electrostrictive element of claim 3, wherein said piezoelectric/electrostrictive layer comprises $(1-x)(Bi_{0.5}Na_{0.5})TiO_3$—$xKNbO_3$ ($0 \leqq x \leqq 0.06$ in mole proportions).

5. The piezoelectric/electrostrictive film element of claim 1, wherein said bonding layer comprises a glass having a softening point at or above a heat treating temperature of said piezoelectric/electrostrictive element.

6. The piezoelectric/electrostrictive film element of claim 3, wherein said bonding layer comprises $(1 \times x)(Bi_{0.5}Na_{0.5})TiO_3$—$xKNbO_3$ ($0.08 \leqq x \leqq 0.5$ in mole proportions).

* * * * *